United States Patent
Ho et al.

(10) Patent No.: US 7,608,848 B2
(45) Date of Patent: Oct. 27, 2009

(54) BRIDGE RESISTANCE RANDOM ACCESS MEMORY DEVICE WITH A SINGULAR CONTACT STRUCTURE

(75) Inventors: ChiaHua Ho, Kaohsiung (TW); Erh-Kun Lai, Taichung County (TW); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 365 days.

(21) Appl. No.: 11/382,422

(22) Filed: May 9, 2006

(65) Prior Publication Data
US 2007/0262388 A1 Nov. 15, 2007

(51) Int. Cl.
*H01L 29/04* (2006.01)
(52) U.S. Cl. .................................. 257/3; 257/E29.17
(58) Field of Classification Search .............. 257/1–4, 257/E29.17
See application file for complete search history.

(56) References Cited

U.S. PATENT DOCUMENTS

| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |
| 4,876,220 | A | 10/1989 | Mohsen et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,534,712 | A | 7/1996 | Ovshinsky et al. |
| 5,687,112 | A | 11/1997 | Ovshinsky |
| 5,789,277 | A | 8/1998 | Zahorik et al. |
| 5,789,758 | A | 8/1998 | Reinberg |
| 5,814,527 | A | 9/1998 | Wolstenholme et al. |
| 5,831,276 | A | 11/1998 | Gonzalez et al. |
| 5,837,564 | A | 11/1998 | Sandhu et al. |
| 5,869,843 | A | 2/1999 | Harshfield |

(Continued)

FOREIGN PATENT DOCUMENTS

WO  WO 00/45108 A1  8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Kenneth A Parker
*Assistant Examiner*—Paul A Budd
(74) *Attorney, Agent, or Firm*—Haynes Beffel & Wolfeld LLP

(57) ABSTRACT

A resistance random access memory in a bridge structure is disclosed that comprises a contact structure where first and second electrodes are located within the contact structure. The first electrode has a circumferential extending shape, such as an annular shape, surrounding an inner wall of the contact structure. The second electrode is located within an interior of the circumferential extending shape and separated from the first electrode by an insulating material. A resistance memory bridge is in contact with an edge surface of the first and second electrodes. The first electrode in the contact structure is connected to a transistor and the second electrode in the contact structure is connected to a bit line. A bit line is connected to the second electrode by a self-aligning process.

18 Claims, 15 Drawing Sheets

U.S. PATENT DOCUMENTS

| | | | |
|---|---|---|---|
| 5,879,955 | A | 3/1999 | Gonzalez et al. |
| 5,920,788 | A | 7/1999 | Reinberg |
| 5,952,671 | A | 9/1999 | Reinberg et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,077,729 | A | 6/2000 | Harshfield |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,473,332 | B1 * | 10/2002 | Ignatiev et al. ............... 365/148 |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,563 | B2 | 10/2004 | Xu |
| 6,815,704 | B1 | 11/2004 | Chen |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,992,932 | B2 | 1/2006 | Cohen |
| 2004/0248339 | A1 | 12/2004 | Lung |
| 2005/0212026 | A1 | 9/2005 | Chung et al. |
| 2005/0215009 | A1 | 9/2005 | Cho |
| 2006/0163554 | A1 * | 7/2006 | Lankhorst et al. ............... 257/4 |

FOREIGN PATENT DOCUMENTS

| | | | |
|---|---|---|---|
| WO | WO 00/79539 | A1 | 12/2000 |
| WO | WO 01/45108 | A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge—Sn—Sb—Te Phase-change Recording Material Having High Crystallization Speed," Proceedings of PCOS 2000, pp, 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

BRIDGE RESISTANCE RANDOM ACCESS MEMORY DEVICE WITH A SINGULAR CONTACT STRUCTURE

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. Contacts in a resistance memory device can occupy a significant amount of space. It is therefore desirable to provide a memory cell structure that reduces the dimension of contacts resulting in an overall reduction in the size of a memory cell.

SUMMARY OF THE INVENTION

The present invention describes a resistance random access memory in a bridge structure comprising a contact structure where first and second electrodes are located within the contact structure. The first electrode has a circumferential extending shape, such as an annular shape, surrounding an inner wall of the contact structure. The second electrode is located within an interior of the circumferential extending shape and separated from the first electrode by an insulating material. A resistance memory bridge is in contact with an edge surface of the first and second electrodes. The first electrode in the contact structure is connected to a transistor and the second electrode in the contact structure is connected to a bit line. A self-aligning process is used to connect a bit line to the second electrode.

In a first embodiment, an intermetal dielectric (IMD) spacer is deposited over the resistance memory material for insulating the resistance memory material from a subsequent liner dielectric breakthrough step in which a bit line is formed inside and over the spacer. In a second embodiment, a via hole is formed over and within a top surface of the second electrode where a bit line is formed inside and over the via. In a third embodiment, a hard mask is formed over the resistance memory material with electrodes etching back, which does not require the formation of a spacer or via.

Broadly stated, a memory device comprises a contact structure having a wall with an inner surface. A first electrode has a circumferentially extending shape and is deposited along the inner surface of the contact structure where the first electrode has an inner surface. An insulating material is formed over a top surface of the tungsten material and around an inner surface of the first electrode. The insulating material has a holding area in which a second electrode is deposited into the holding area of the insulating material such that the insulating material serves to separate the first and second electrodes.

Advantageously, the present invention reduces the overall dimension of a memory cell by having it share a single contact structure divided into two portions for use in connecting to a transistor and a bit line, eliminating the need for a second contact structure as required in a conventional design.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
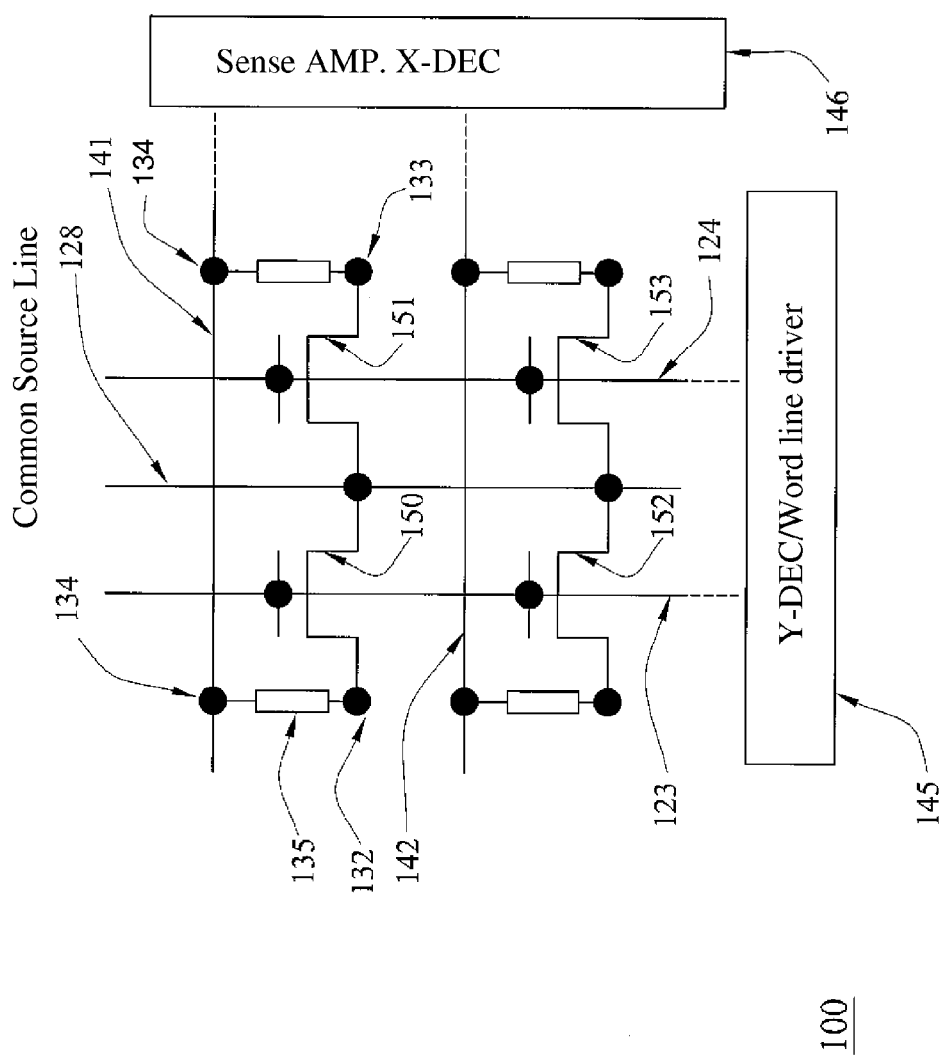
FIG. 1 illustrates a schematic diagram of a bistable resistance random access memory array in accordance with the present invention.

A description of structural embodiments and methods of the present invention is provided with reference to FIGS. 1-15. It is to be understood that there is no intention to limit the invention to the specifically disclosed embodiments but that the invention may be practiced using other features, elements, methods and embodiments. Like elements in various embodiments are commonly referred to with like reference numerals.

Referring now to FIG. 1, there is shown a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode-member 132 for side wall pin memory cell 135, which has top electrode member 134. The top electrode member 134 is coupled to the bit line 141. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
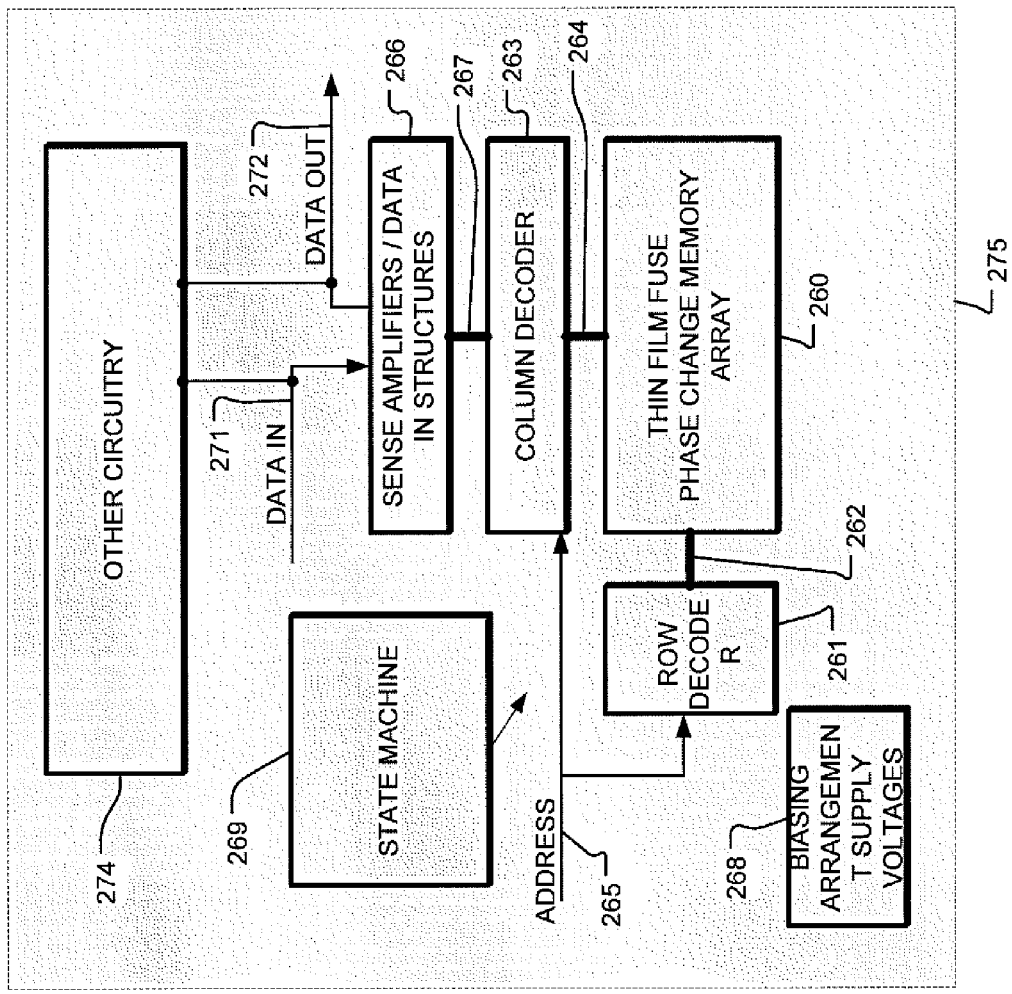
FIG. 2 illustrates a simplified block diagram of an integrated circuit according to an embodiment of the present invention.

As illustrated in FIG. 2, there is shown a simplified block diagram of an integrated circuit 200 according to an embodiment of the present invention. The integrated circuit 274 includes a memory array implemented using side wall active pin bistable resistance random access memory cells, on a semiconductor substrate. A row decoder 256 is coupled to a plurality of word lines 262, and arranged along rows in the memory array 260. A pin decoder 263 is coupled to a plurality of bit lines 264 arranged along pins in the memory array 255 for reading and programming data from the side wall pin memory cells in the array 255. Addresses are supplied on a bus 265 to a pin decoder 263 and a row decoder 261. Sense amplifiers and data-in structures in a block 266 are coupled to the pin decoder 263 via a data bus 267. Data is supplied via the data-in line 271 from input/output ports on the integrated circuit 275 or from other data sources internal or external to the integrated circuit 275, to the data-in structures in the block 259. In the illustrated embodiment, other circuitry is included on the integrated circuit, such as a general purpose processor or special purpose application circuitry, or a combination of modules providing system-on-a-chip functionality supported by the thin film fuse bistable resistance random access memory cell array. Data is supplied via the data-out line 272 from the sense amplifiers in block 259 to input/output ports on the integrated circuit 275, or to other data destinations internal or external to the integrated circuit 275.

A controller implemented in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
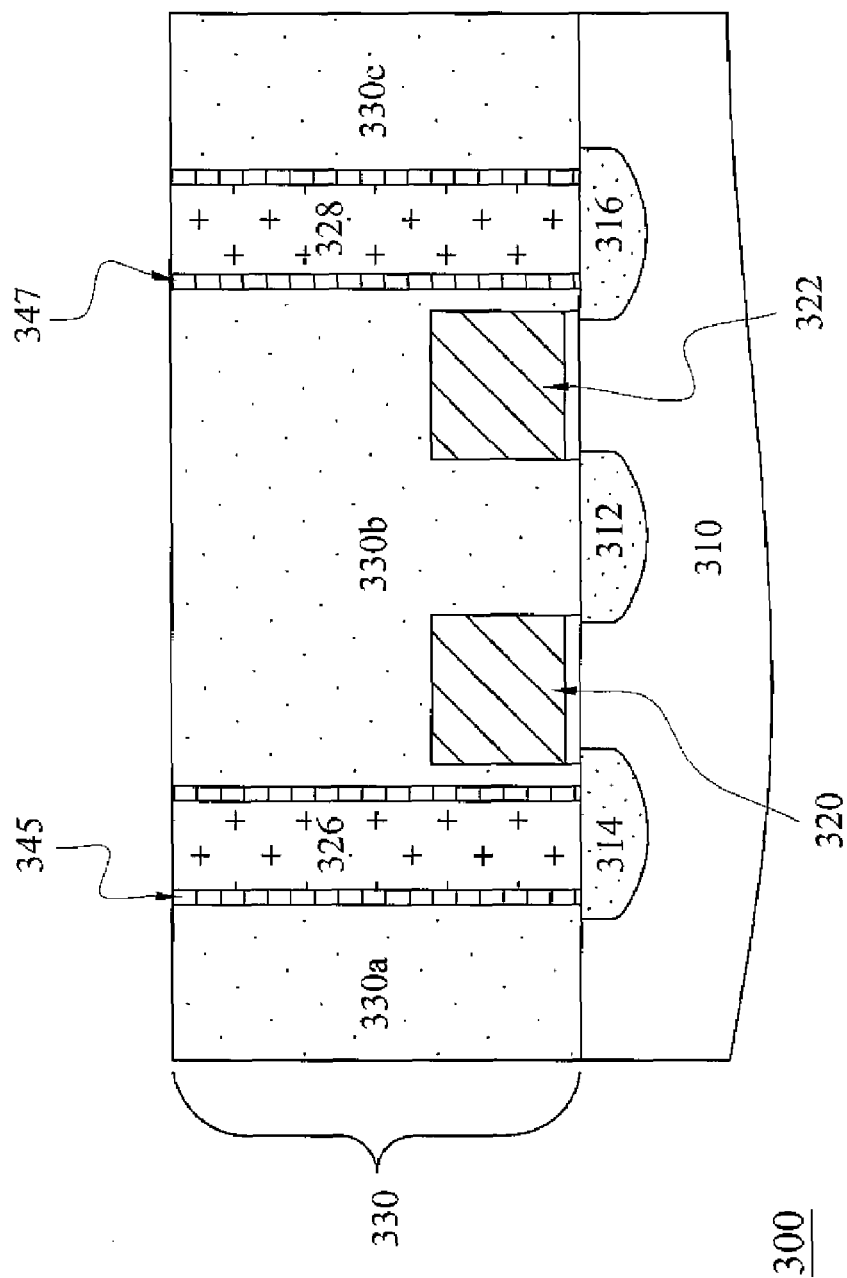
FIG. 3 illustrates a cross-sectional view of a process diagram showing a first step in the manufacturing of a bistable resistive random access memory with the formation of a transistor structure in accordance with the first embodiment of the present invention.

FIG. 3 illustrates a cross-sectional view of a process diagram showing a first step in the manufacturing of a bistable resistive random access memory 300 with the formation of a transistor structure in accordance with the first embodiment. The bistable resistive random access memory 300 is formed on a semiconductor substrate 310. Access transistors are formed by an n-type terminal 312 acting as a common source region and n-type terminals 314 and 316 acting as drain regions in the p-type substrate 310. Polysilicon word (gate) lines 320, 322 form the gates of the access transistors. An inter-layer dielectric 330 includes dielectric fills 330a, 330b and 330c where the dielectric fill 330b is formed over the polysilicon word lines 320, 322. Suitable materials for implementing the inter-layer dielectric 330 include BPSG oxide and PETEOS oxide. The inter-layer dielectric 330 is patterned and conductive structures, including a common source line (not shown) and contact structures 326 and 328, are formed. The conductive material can be implemented with tungsten or other materials and combinations that are suitable for the contact structures 326, 328. The contact structures 326, 328 comprise various shapes including circular, rectangular or other shapes suitable for serving as a contact plug depending on a selected design.

A first electrode 345 has a circumferential extending shape, such as an annular shape, that surrounds an inner wall of the contact structure 326. Similarly, a first electrode 347 has a circumferential extending shape, such as an annular shape, that surrounds an inner wall of the contact structure 328. Each of the first electrodes 345, 347 is made of a conductive material such as titanium nitride. The conductive material can be tungsten or other materials and combinations suitable for the plug and lines structures. The common source line contacts the source region and acts as a common source line along a row in the array. The contact structures 326, 328 contact the drain terminals 314 and 316, respectively.

Figure 4:
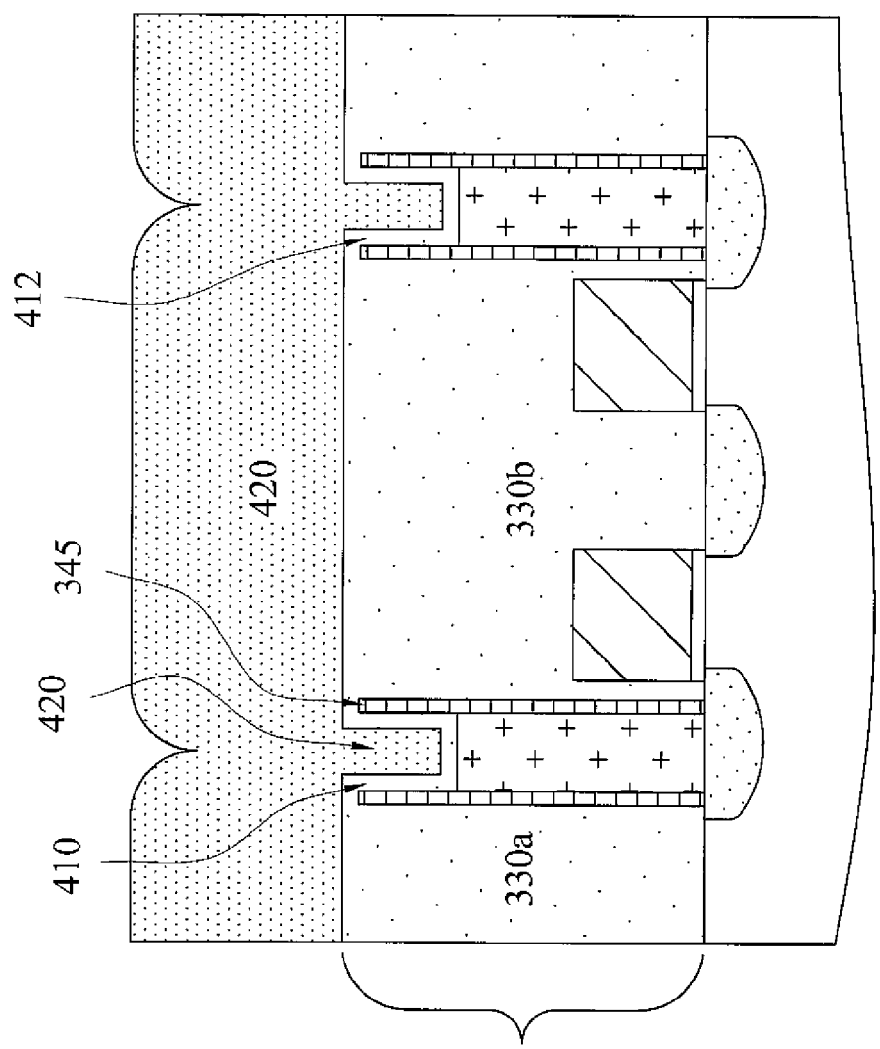
FIG. 4 illustrates a cross-sectional view of a process diagram showing a second step in the manufacturing of the bistable bridge resistance random access memory in the first embodiment with a tungsten recess etch, a liner dielectric deposition and a second electrode deposition in accordance with the first embodiment of the present invention.

FIG. 4 illustrates a cross-sectional view of a process diagram 400 showing a second step in the manufacturing of the bistable bridge resistance random access memory in the first embodiment with a tungsten recess etch, a liner dielectric deposition and a second electrode deposition. In the contact structure 326, a top portion of the tungsten in the contact structure 326 is etched with an etched ratio of about 1:1. During the etching step, the selectivities of the inter-layer dielectric 330 are sufficiently high to prevent causing damage to the dielectric fills 330a, 330b from etching. A suitable type of chemistry for tungsten etching is Sulfur Hexafluoride ($SF_6$). The depth of tungsten etching is chosen relative to the size of a contact hole. In one embodiment, the tungsten etching depth of the contact structure 326 is about 200 nm for a 0.2 µm contact hole. A liner dielectric 410 is deposited over the remaining portion of the tungsten in the contact structure 326 and along an inner wall of the first electrode 345 by a chemical vapor deposition (CVD) process. The liner dielectric 410 is selected with a material that possesses characteristics of a low thermal conductivity, such as silicon oxide. A second electrode 420 is deposited into the liner dielectric 410, a liner dielectric 412 and over top surfaces of the dielectric fills 330a, 330b, 330c. The second electrode 420 can be implemented with W, TiN, TaN, or other material that provides sufficient electrical conductivity while having low thermal conductivity characteristics.

The liner dielectric 410 in the pipe-shaped cells may include silicon oxide, silicon oxynitride, silicon nitride, $Al_2O_3$, other low K (low permitivity) dielectrics, or an ONO or SONO multi-layer structure. Alternatively, the fill may comprise an electrical insulator including one or more elements selected from the group consisting of Si, Ti, Al, Ta, N, O, and C. In preferred devices, the fill has a low thermal conductivity, less than about 0.014 J/cm*K*sec. In other preferred embodiments, the thermal insulator has a thermal conductivity less than that of the amorphous state of the phase change material, or less than about 0.003 J/cm*K* sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating cap layer include $SiO_2$, SiCOH, polyimide, polyamide, and fluorocarbon polymers. Other examples of materials which are candidates for use for the thermally insulating cap layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within the pipe can provide thermal and electrical insulation.

Figure 5:
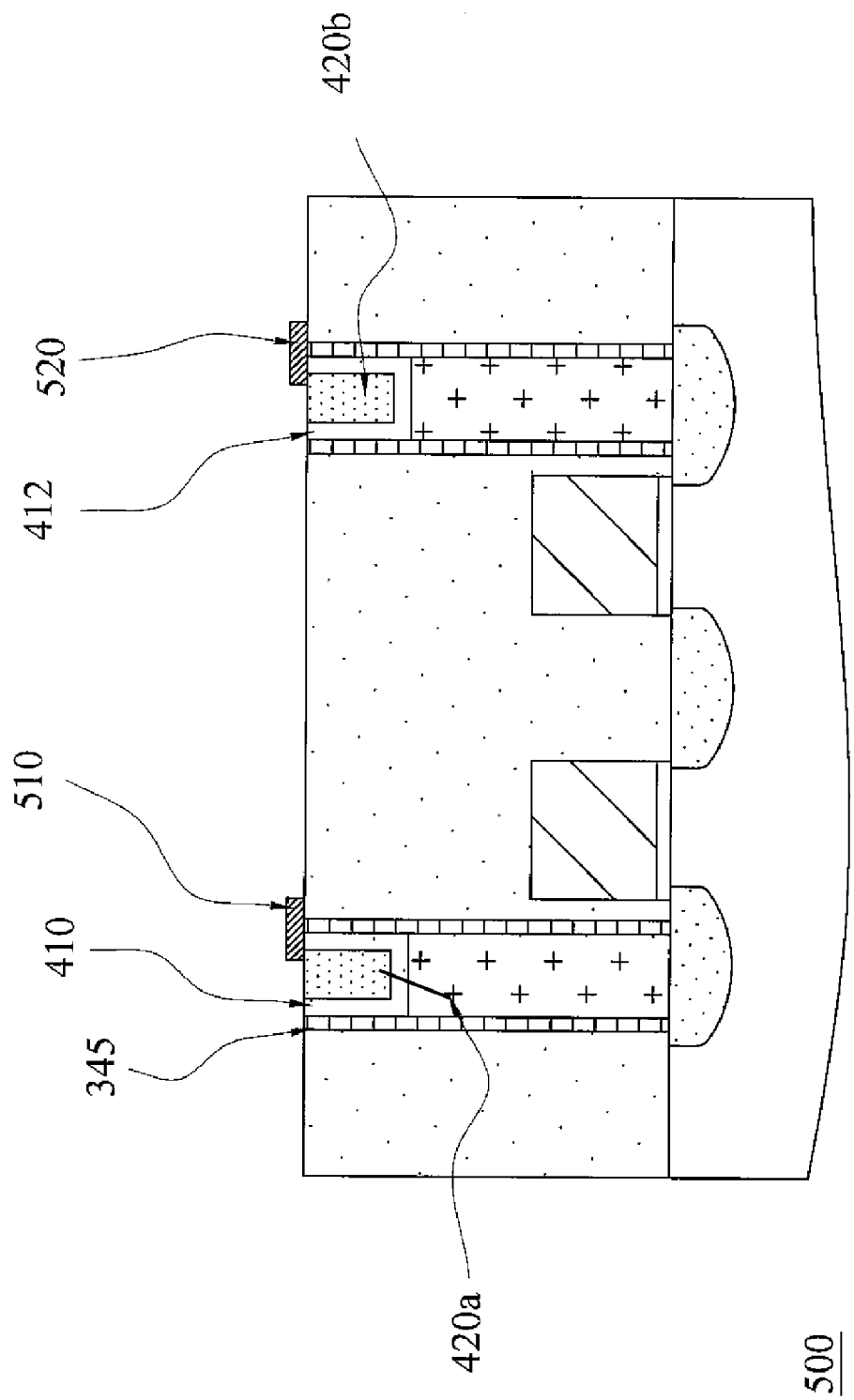
FIG. 5 illustrates a cross-sectional view of a process diagram showing a third step in the manufacturing of the bistable bridge resistance random access memory in the first embodiment with a second electrode polishing, a resistance memory material deposition and patterning in accordance with the first embodiment of the present invention.

FIG. 5 illustrates a cross-sectional view of a process diagram 500 showing a third step in the manufacturing of the bistable bridge resistance random access memory in the first embodiment with a second electrode polishing, a resistance memory material deposition and patterning. A top surface of the second electrode 420 is polished to remove excess materials that are spilled outside the contact structures 326, 328, which results in a second electrode 420a in the first contact structure 326 and a second electrode 420b in the second contact structure 328. Embodiments of the process for polishing include a chemical mechanical polishing process, followed by brush clean and liquid and/or gas clean procedures, as known in the art. Alternatively, the chemical mechanical polishing may be conducted to an over-polish degree in order to enable the liner dielectric 410 that may protrude beyond the contact structure 326 to also be removed. The second electrode 420a is separated from the first electrode 345 by the thin liner dielectric 410. Top surfaces of the first electrode 345, the liner dielectric 410 and the second electrode 420a are on a same plane.

A resistance memory material is patterned by photolithography to form a resistance memory material bridge 510 where the length of the resistance memory material bridge 510 is larger than the thickness of the liner dielectric 410. Similarly, a resistance memory material is patterned by photolithography to form a resistance memory material bridge 520 where the length of the resistance memory material bridge 520 is larger than the thickness of the liner dielectric 412. The resistance memory material bridge 510 is etched to enable a connection with the first electrode 345 and the second electrode 420a. A suitable shape of the resistance memory material bridge 510 is rectangular, but other shapes may also be used. A preferred width of the resistance memory material bridge 510 is in the range of 10 to 80 nm.

The resistive memory material bridges 510, 520 can be selected from a wide variety of materials, including but not limited to, a chalcogenide material, a colossal magnetoresistive (CMR) material, a two-element compound and a polymer material. Embodiments of the memory cell include phase change based memory materials, including chalcogenide based materials and other materials, for the bridge. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as TeaGebSb100-(a+b). One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_xSb_yTe_z$ with x:y:z=2:2:5. Other compositions of $Ge_xSb_yTe_z$ include x:0~5; y:0~5; z:0~10.

Other programmable resistive memory materials may be used in other embodiments of the invention, including N2 doped GST, $Ge_xSb_y$, or other material that uses different crystal phase changes to determine resistive; $Pr_xCa_yMnO_3$, PrSrMnO, ZrOx, or other material that uses an electrical pulse to change the resistive state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistive state controlled by an electrical pulse; a colossal magnetoresistive (CMR) material such as PrxCayMnO3 with x:y=0.5:0.5, or other composition with x:0~1; y:0~1, or another CMR material that includes Mn oxide; and a two-element compound such as $Ni_xO_y$ where x:y=0.5:0.5, or other composition with x:0~1; y:0~1.

Figure 6:
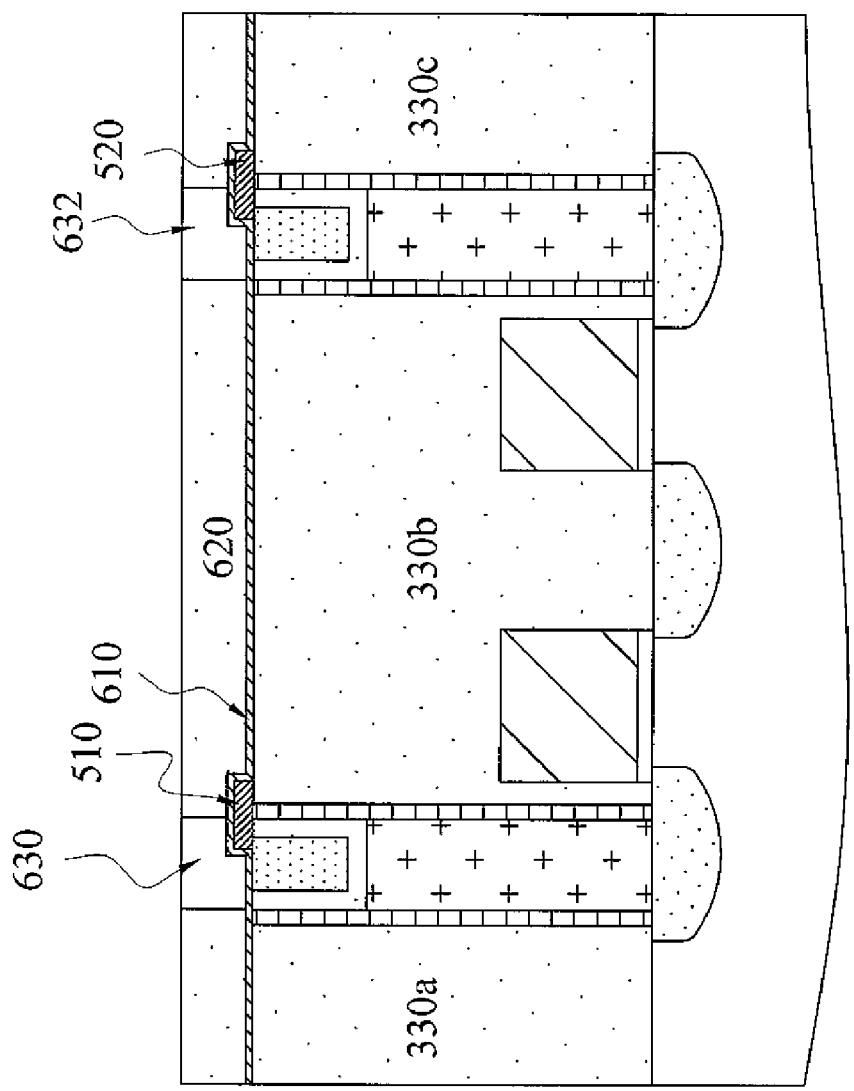
FIG. 6 illustrates a cross-sectional view of a process diagram showing a fourth step in the manufacturing of the bistable bridge resistance random access memory in the first embodiment with a second liner dielectric deposition, an intermetal dielectric deposition, and a via patterning in accordance with the first embodiment of the present invention.

FIG. 6 illustrates a cross-sectional view of a process diagram 600 showing a fourth step in the manufacturing of the bistable bridge resistance random access memory in the first embodiment with a second liner dielectric deposition, an intermetal dielectric deposition, and a via patterning. A second liner dielectric 610 is deposited over the resistance memory material bridges 510, 520 as well as across top surfaces of the process diagram 600. The second liner dielectric 610 possesses desirable conformal characteristics. An intermetal dielectric 620 is formed over a top surface of the second liner dielectric 610. The intermetal dielectric 620 has an etching selectivity substantially the same or similar to the second liner dielectric 610. A suitable material for the implementing the intermetal dielectric 620 is silicon oxide. A first via 630 is patterned with etching stops on the second liner dielectric 610. A second via 632 is patterned with etching stops on the second liner dielectric 610. A suitable type of chemistry for via etching is to use F-based dry etching with selective stops on the second liner dielectric 610.

Figure 7:
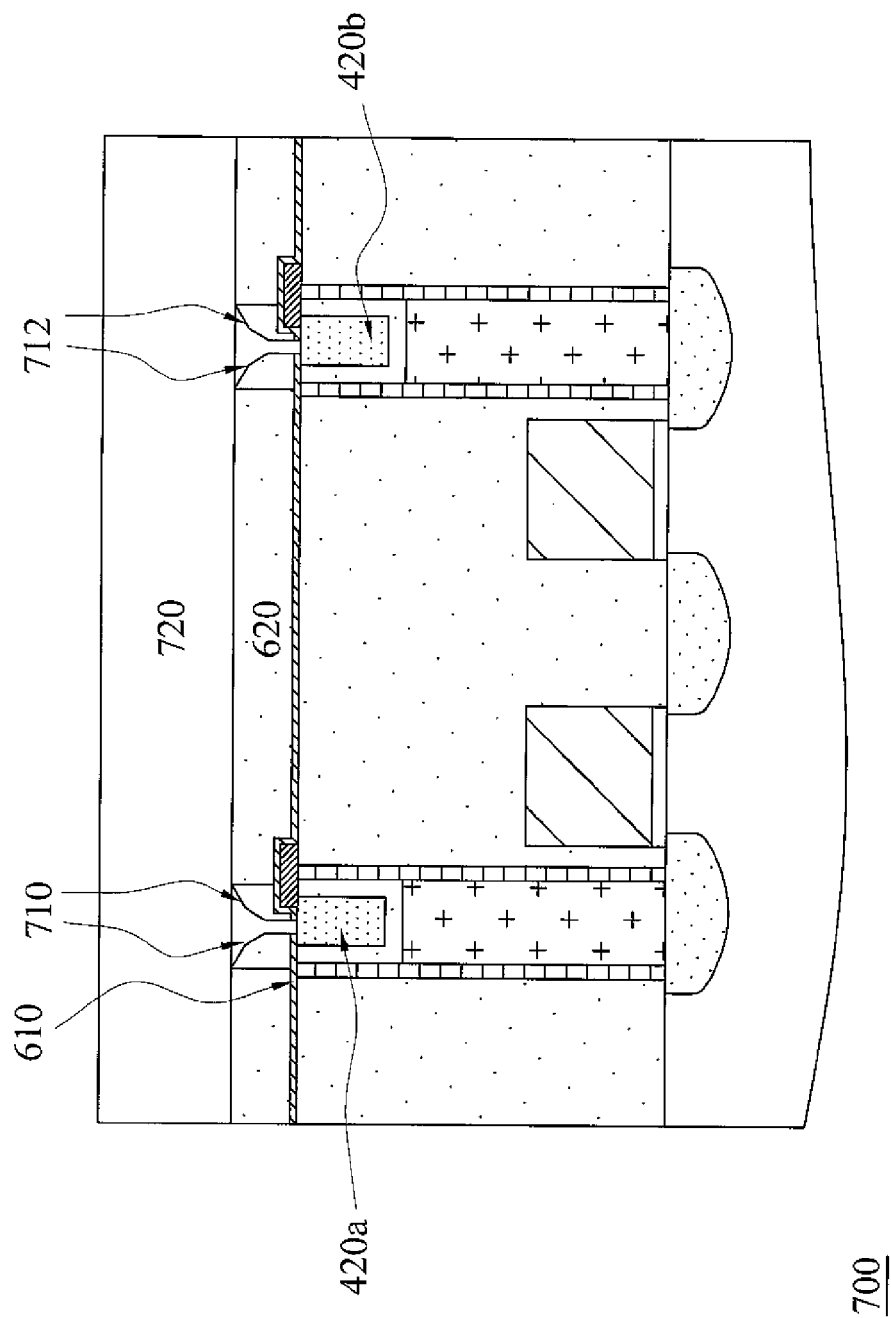
FIG. 7 illustrates a cross-sectional view of a process diagram showing a fifth step in the manufacturing of the bistable bridge resistance random access memory in the first embodiment with an intermetal dielectric spacer, a second dielectric breakthrough and a bit line formation in accordance with the first embodiment of the present invention.

FIG. 7 illustrates a cross-sectional view of a process diagram 700 showing a fifth step in the manufacturing of the bistable bridge resistance random access memory in the first embodiment with an intermetal dielectric spacer, a second dielectric breakthrough and a bit line formation. Intermetal spacers 710, 712 are deposited into the vias 630, 632 by chemical vapor deposition. The purpose of the intermetal spacers 710, 712 is to protect resistance memory materials after a second dielectric breakthrough step. When spacer etching of the intermetal spacers 710, 712 stops at the second liner dielectric 610, the second dielectric breakthrough step is carried out using an anisotropic F-based dry etching process, which stops on a top surface of the second electrodes 420a, 420b. A bit line 720 is deposited into the intermetal spacers 710, 712 with a layer of metallization above the intermetal dielectric 620. The direction of the bit line 720 is perpendicular to a gate or word line.

Figure 8:
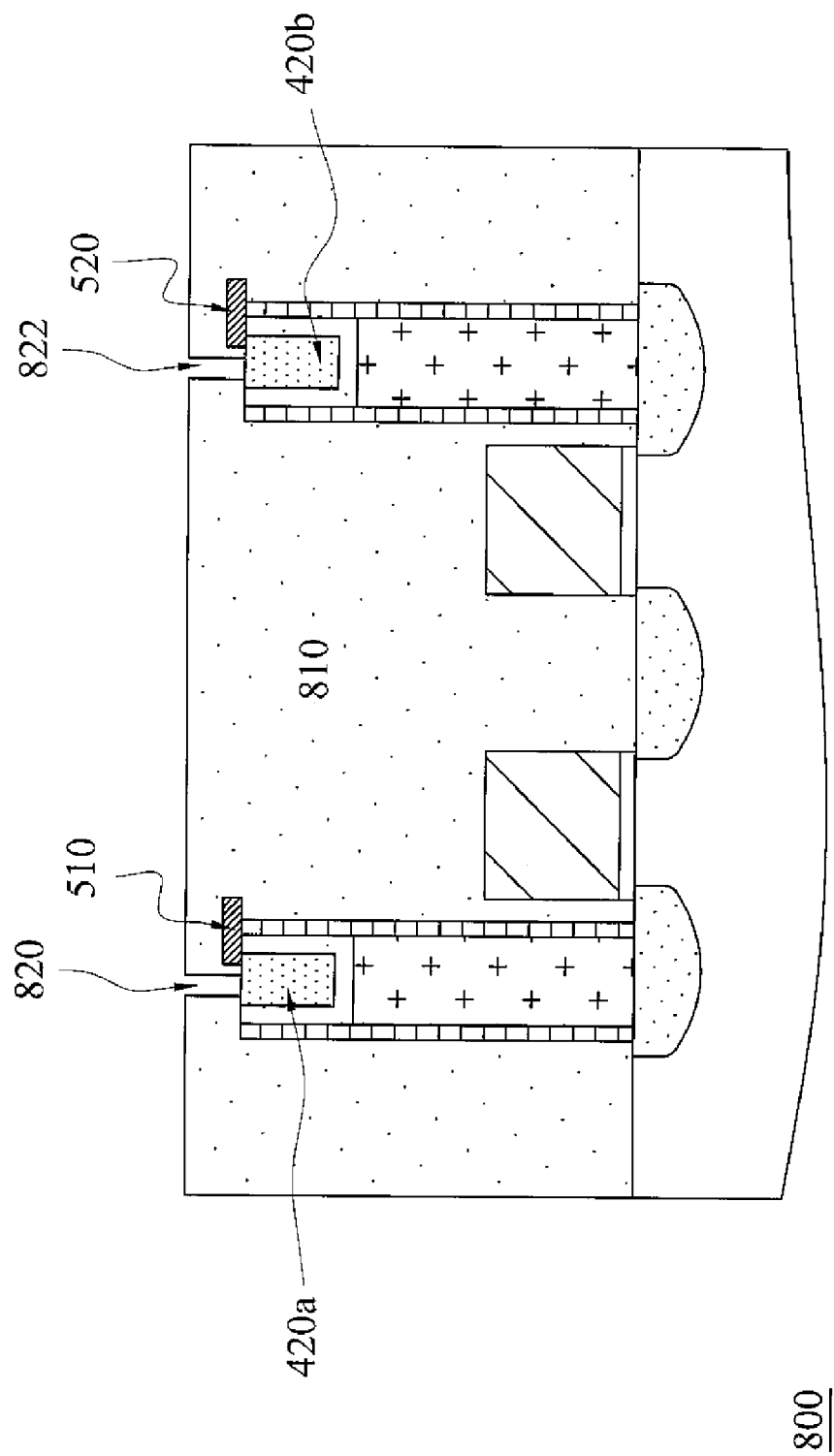
FIG. 8 illustrates a cross-sectional view of a process diagram showing a second embodiment of a bridge resistance random access memory with a deposition of intermetal dielectric and patterning of vias in accordance with the first embodiment of the present invention.
Figure 9:
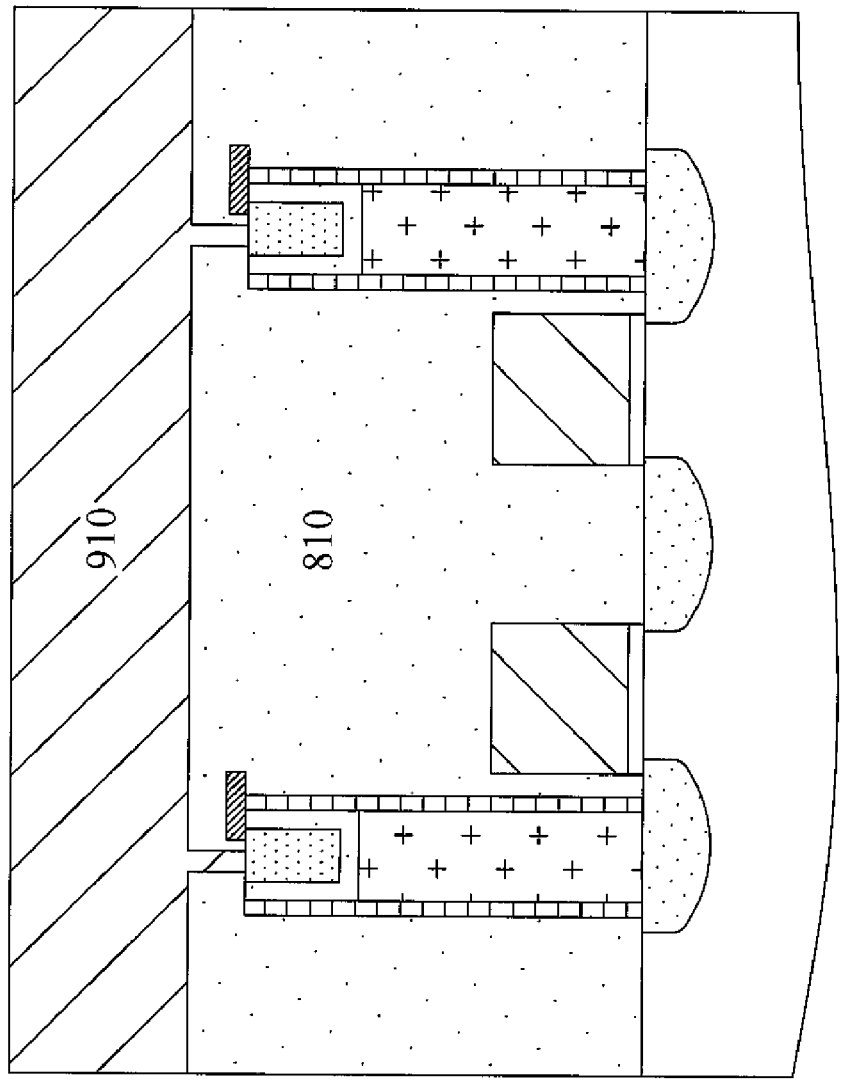
FIG. 9 illustrates a cross-sectional view of a process diagram showing the next step in the manufacturing of the bistable bridge resistance random access memory with the deposition of a bit line in accordance with the second embodiment of the present invention.

FIG. 8 is a process diagram illustrating a cross-sectional view of a second embodiment of a bridged resistance random access memory 800 with a deposition of intermetal dielectric 810 and patterning of vias 820, 822. The intermetal dielectric 810 is deposited over the resistance memory material bridges 510, 520, without a second linear dielectric as shown and described in the first embodiment. Silicon oxide is an example of a suitable material for implementing the intermetal dielectric 810. A first via 820 is patterned with etching stops on the top surface of the second electrode 420a. The dimension of the via 820 is chosen so that the via 820 is sufficiently small to land on the second electrode 420a. A suitable type of chemistry for via etching is to use F-based dry etching with selective stops on the second liner dielectric 610. The via 820 has an aspect ratio of about 1~2. FIG. 9 is a process diagram 900 illustrating a cross-sectional view of the second embodiment of the bridge resistance random access memory with the deposition of a bit line 910. The bit line 910 is deposited into the vias 820, 822 with a layer of metallization above the intermetal dielectric 810. The direction of the bit line 910 is perpendicular to a gate or word line.

Figure 10:
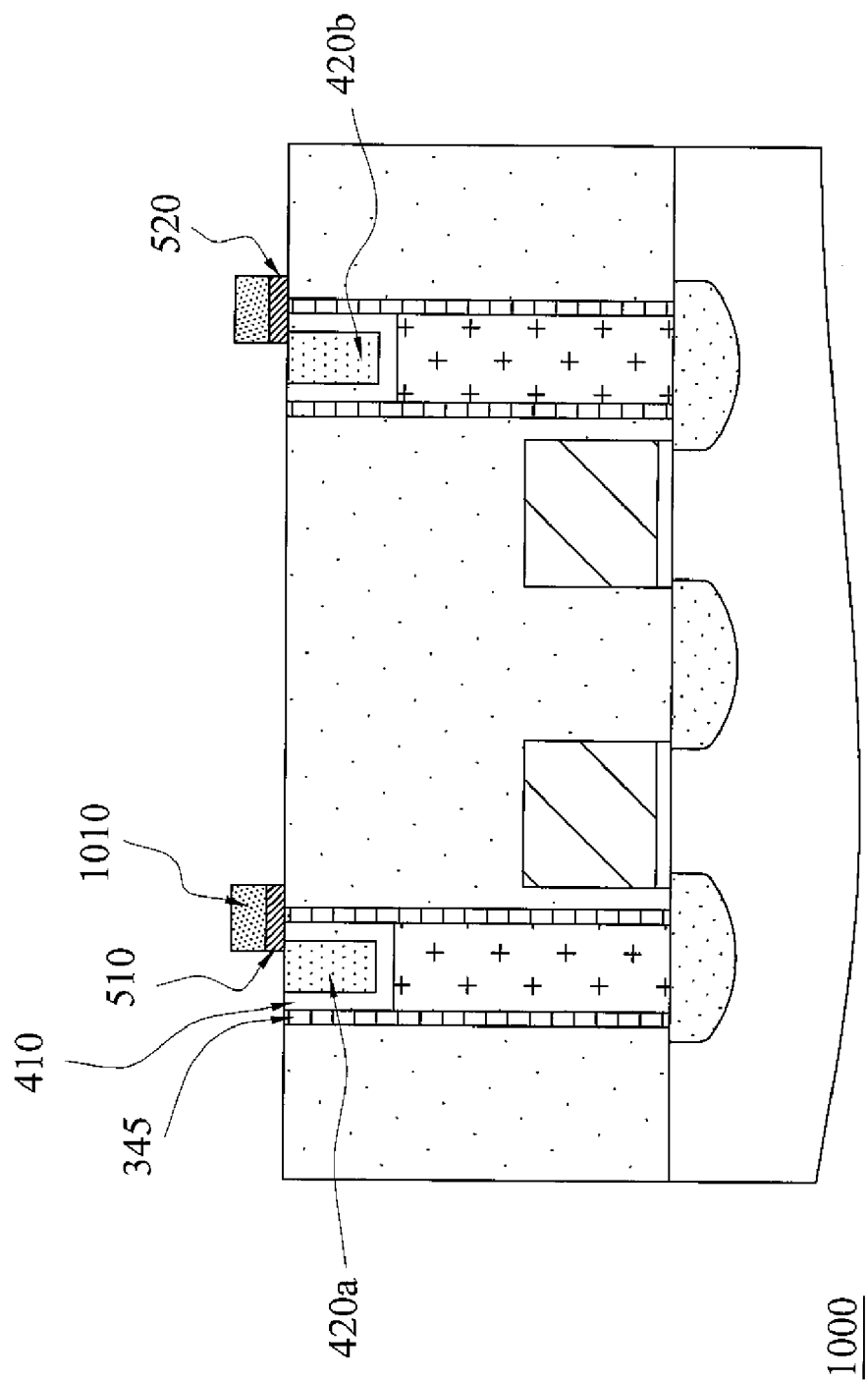
FIG. 10 illustrates a cross-sectional view of a process diagram showing the next step in the manufacturing of the bistable bridge resistance random access memory with the deposition of a hard mask on a resistance memory material bridge in accordance with the second embodiment of the present invention.

FIG. 10 is a process diagram 1000 illustrating a cross-sectional view of a third embodiment of the bridge resistance random access memory with the deposition of a hard mask on a resistance memory material bridge. A top surface of the second electrode 420 is polished to remove excess materials that are outside the contact structures 326, 328, which results in a second electrode 420a in the first contact structure 326 and a second electrode 420b in the second contact structure 328. Embodiments of the process for polishing include a chemical mechanical polishing process, followed by brush clean and liquid and/or gas clean procedures, as known in the art. Alternatively, the chemical mechanical polishing may be conducted to an over-polish degree in order to enable the liner dielectric 410 that may protrude beyond the contact structure 326 to also be removed. The second electrode 420a is separated from the first electrode 345 by the thin liner dielectric 410. Top surfaces of the first electrode 345, the liner dielectric 410 and the second electrode 420a are on a same plane.

A resistance memory material is patterned by photolithography to form the resistance memory material bridge 510 where the length of the resistance memory material bridge 510 is larger than the thickness of the liner dielectric 410. Similarly, a resistance memory material is patterned by photolithography to form a resistance memory material bridge 520 where the length of the resistance memory material bridge 520 is larger than the thickness of the liner dielectric 412. The resistance memory material bridge 510 is etched to enable a connection with the first electrode 345 and the second electrode 420a. A suitable shape of the resistance memory material bridge 510 is rectangular, but other shapes may also be used. A preferred width of the resistance memory material bridge 510 is in the range of 10 to 80 nm.

Figure 11:
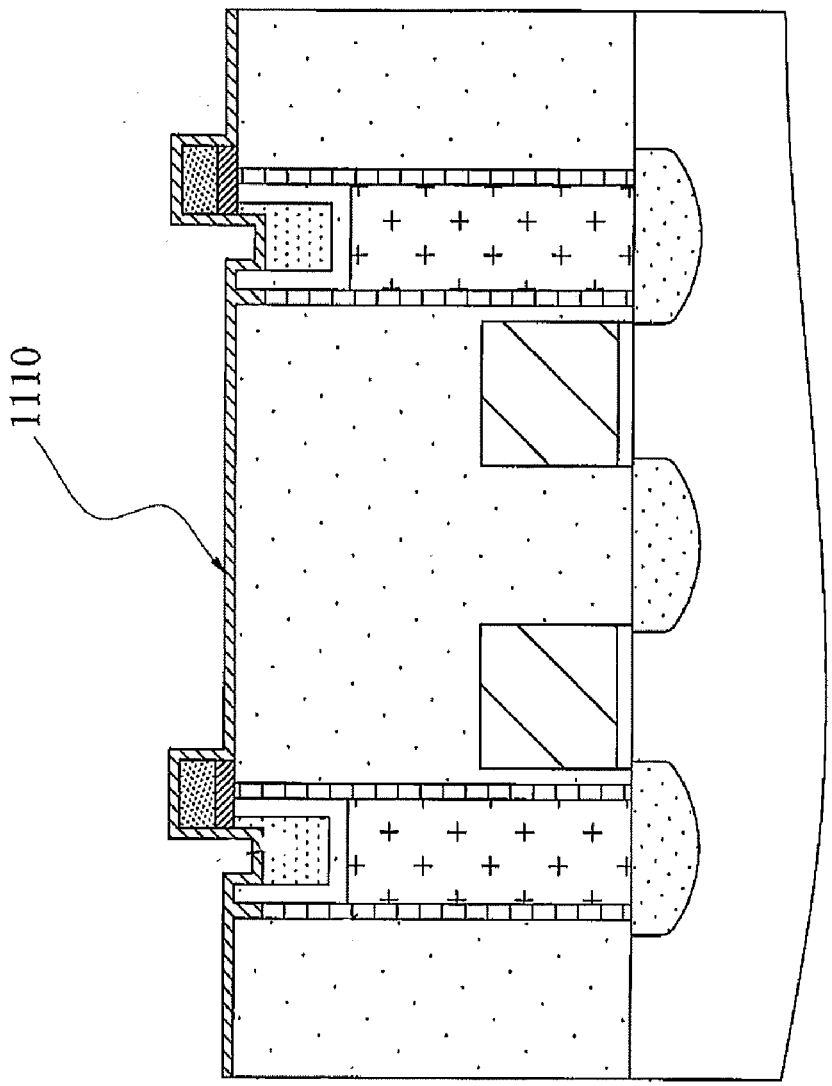
FIG. 11 illustrates a cross-sectional view of a process diagram showing a third embodiment of the bridge resistance random access memory with etch back of first and second electrodes and a liner dielectric deposition in accordance with the present invention.

A hard mask 1010 is deposited on the resistance memory material bridge 510. The hard mask 1010 comprises a dielectric material such as silicon oxide. The etch process may be a single anisotropic etch for both the hard mask 1010, and the first and second electrodes 345, 420a, or a two-step process, first etching the hard mask 1010 with a first etch chemistry, and second etching the first and second electrodes 345, 420a with a second etch chemistry. In one embodiment, the etching rate of the hard mask 1010 is significantly less than the etch rate of the second electrode 420b and sidewalls of first electrode 345 in the contact structure 326. A suitable etching type is a dry etching with $Cl_2$-based chemistries FIG. 11 is a process diagram 1100 illustrating a cross-sectional view of the third embodiment of the bridge resistance random access memory with etch back of first and second electrodes and a liner dielectric deposition. The etch back of the first and second electrodes 345, 420a can depend on the type of materials. In one embodiment, the first and second electrodes 345, 420a are implemented using TiN. The etch back of the TiN in the first and second electrodes 345, 420a can be accomplished by dry etching with $Cl_2$-based chemistries. In another embodiment, the first electrode 345 comprises TiN material and the second electrode 420a comprises W material. The etch back of the TiN material and the W material can be accomplished by a 2-step dry etching process, where $Cl_2$-based chemistries are used to etch TiN during a first etching step and $SF_6$-based chemistries are used to etch W during a second etching step. After the etching back, a liner dielectric 1110 is deposited across the top of the process diagram 1100. The liner dielectric 1110 is selected to be sufficiently conformal so that the deposition of the liner dielectric 1110 enables a dielectric fill in a hole after the etching back of the first electrode 345. The liner dielectric 1110 can be selected from a material such as silicon nitride SiN or silicon oxide. A suitable thickness of the liner dielectric 1110 is about 20 nm.

Figure 12:
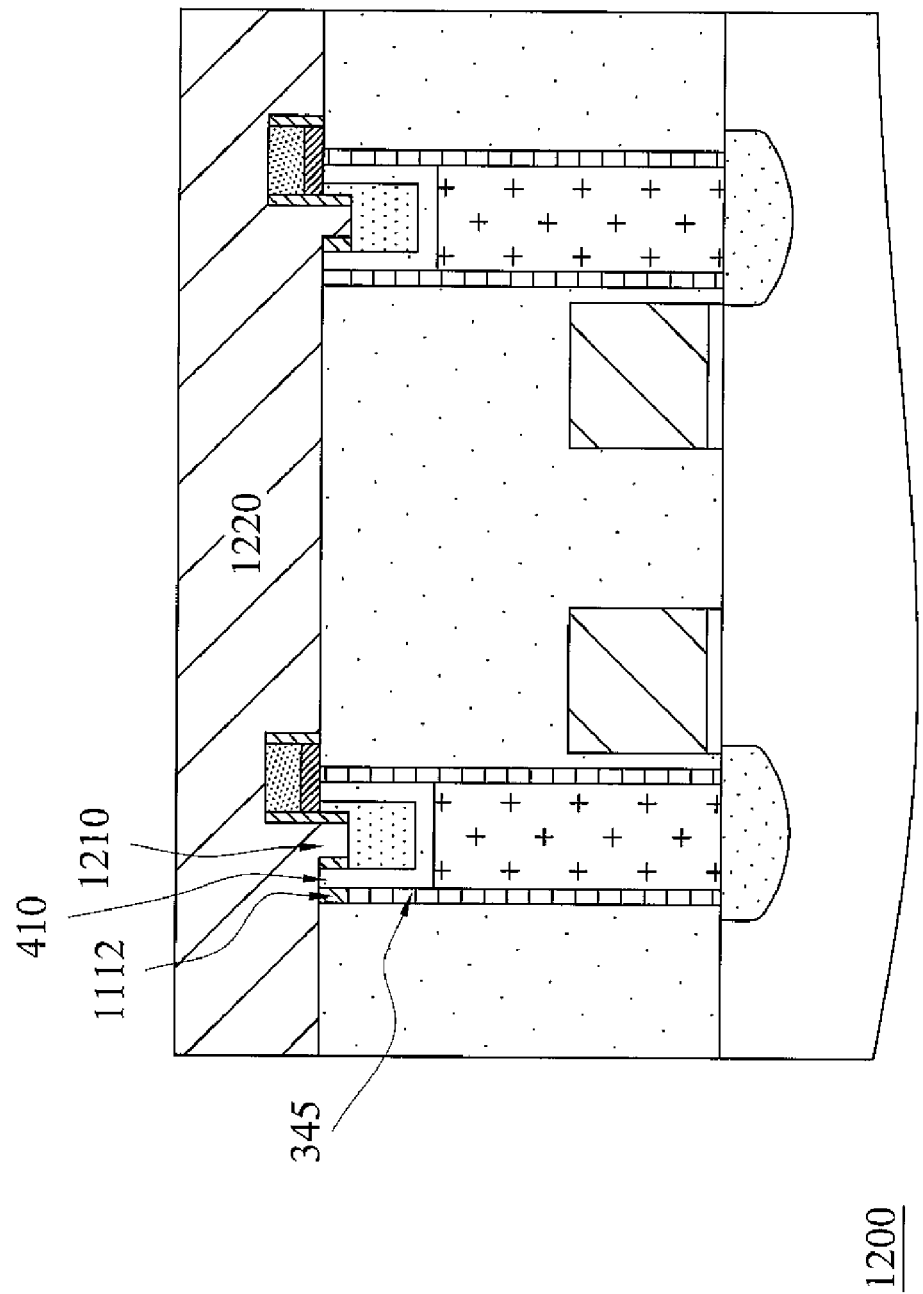
FIG. 12 illustrates a cross-sectional view of a process diagram showing the next step in the manufacturing of the bridge resistance random access memory with a dielectric spacer etching and a bit line formation in accordance with the third embodiment of present invention.

FIG. 12 is a process diagram 1200 illustrating a cross-sectional view of the third embodiment of the bridge resistance random access memory with a dielectric spacer etching and a bit line formation. The liner dielectric 1110 in FIG. 11 is etched to form a dielectric spacer on a sidewall. The dielectric spacer is positioned on the top surface of the second electrode 420a, while the remaining liner dielectric separates the first electrode 345 from the second electrode 420a. In the first electrode 345, the liner dielectric 1110 on the surface can be removed but the liner dielectric fill-in 1112 remains on the first electrode 345. The dielectric spacer 1210 may be etched by an anisotropic dry etch with F-based chemistries. After the dielectric spacer 1210 formation, a bit line 1220 is deposited into the dielectric spacer 1210 with a layer of metallization. The direction of the bit line 1220 is perpendicular to a gate or word line.

Figure 13:
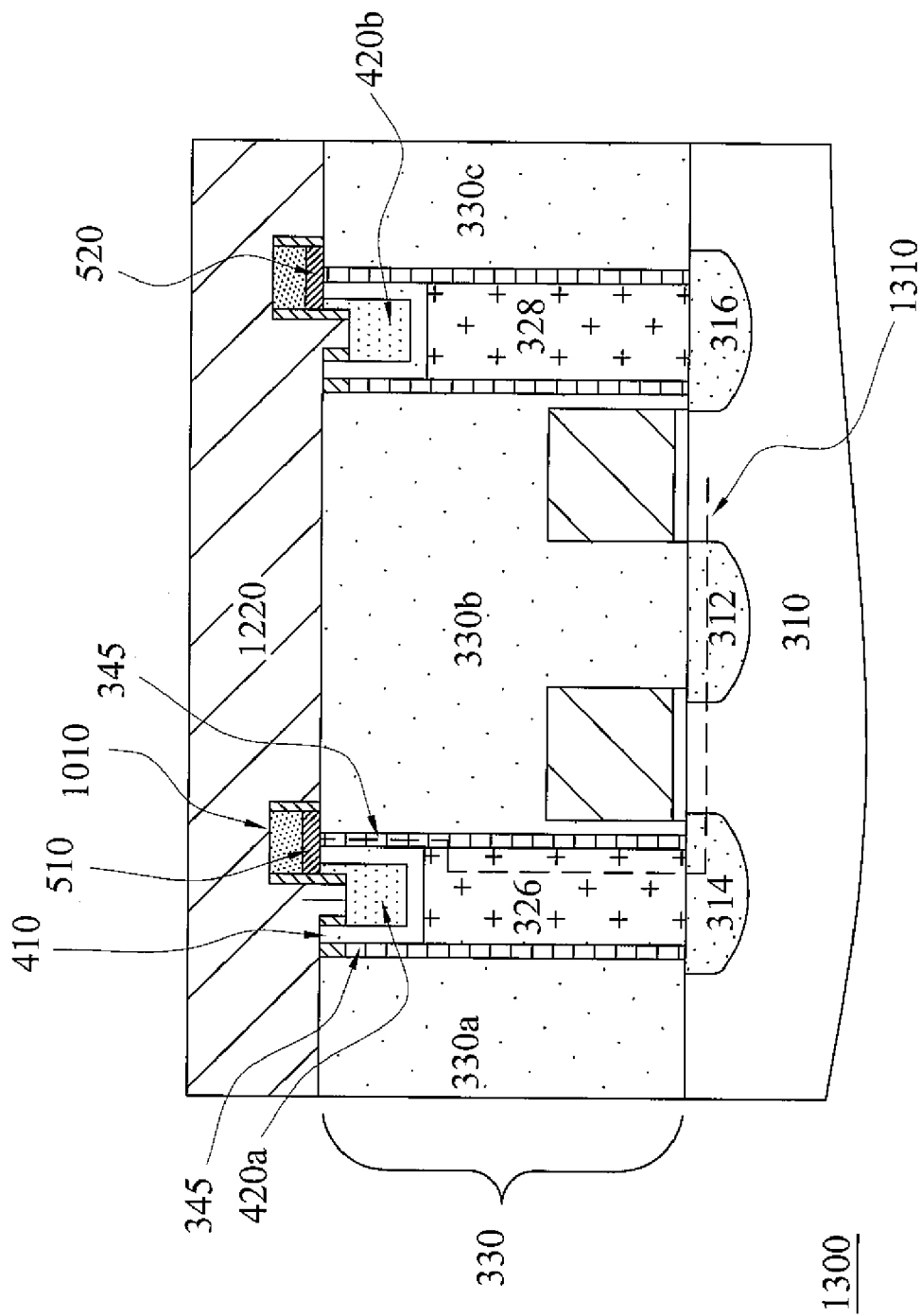
FIG. 13 illustrates a cross-sectional view of a process diagram showing an example of the bridge resistance random access memory with a sample path of current flow in accordance with the present invention.
Figure 14:
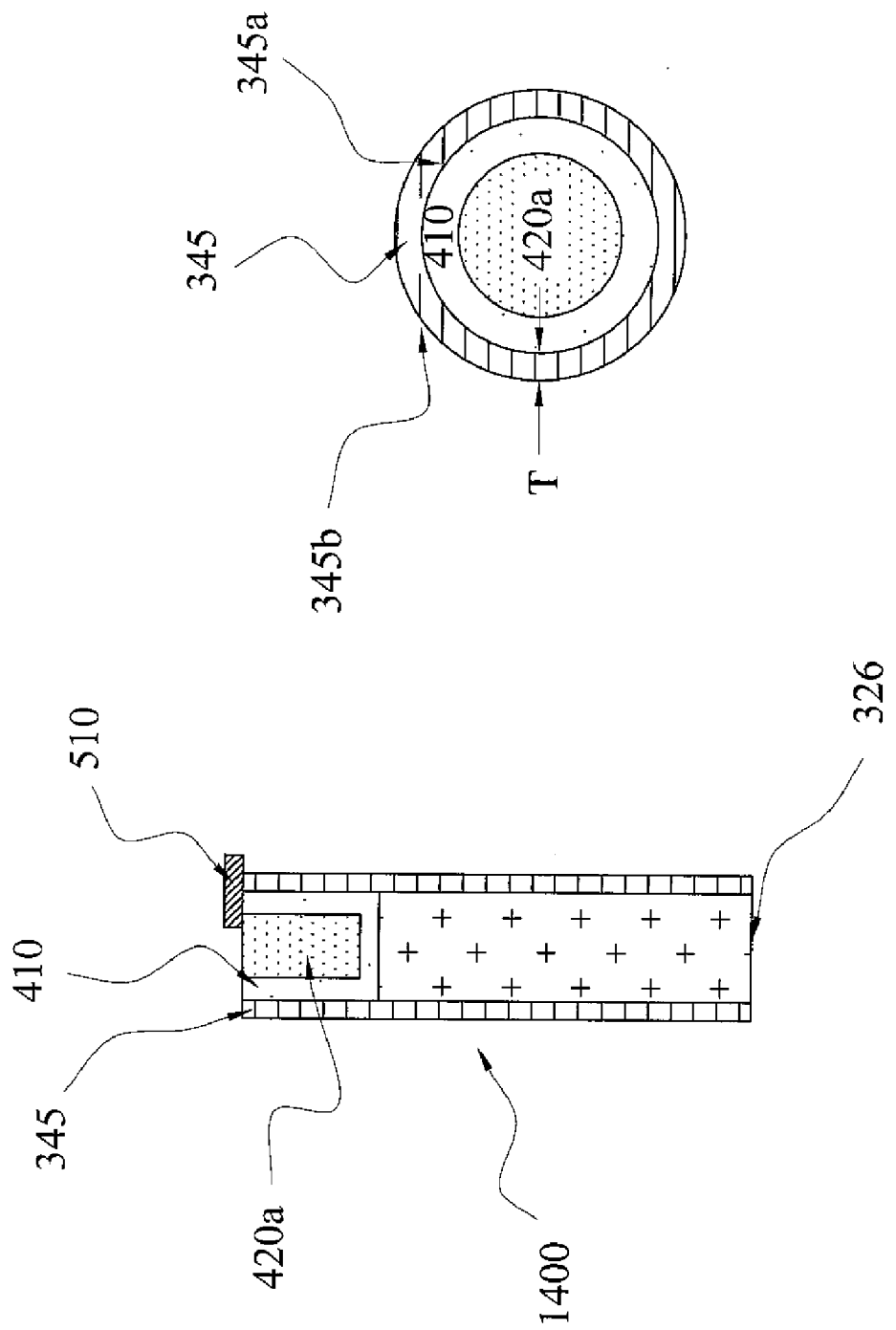
FIG. 14A illustrates a cross-sectional view of an embodiment of a memory cell based on a pipe-shaped electrode coupled to a programmable resistive material in accordance with the present invention.
FIG. 14B illustrates an orthogonal cross-sectional view of an embodiment of a pipe-shaped member of first and second electrodes in accordance with the present invention.

FIG. 13 is a process diagram 1300 illustrating a cross-sectional view of the third embodiment of the bridge resistance random access memory with a sample path of a current flow 1310, In one sample path, the electrical current flows from the source 312, through the drain 314, through the contact structure 326, through the first electrode 345, through the resistance memory material bridge 510, through the second electrode 420a and to the bit line 1220.

FIG. 14A illustrates a cross-sectional view of an embodiment of a memory cell based on a pipe-shaped member 1400 coupled to the programmable resistive material 510, while FIG. 14B illustrates an orthogonal cross-sectional view of an embodiment of a pipe-shaped member of first and second electrodes. The pipe-shaped member 1400 comprises sidewalls having an inside surface 345a and an outside surface 345b, which are cylinder-like. The first electrode 345 has a thickness T defined between the inside surface 345a and the outside surface 345b. Thus, the inside and outside surfaces 345a, 345b can be understood as basically cylindrical surfaces, classically defined as surfaces traced by a line moving parallel to a fixed line and intersecting a fixed curve, where for a circular cylinder the fixed line lies at the center, or axis, of the pipe-shaped member and the fixed curve is a circle centered on the fixed line. The inside and outside surfaces 345a, 345b for this circular cylindrical shape would be defined by respective circles having radii that differ by the thickness of the wall of the pipe-shaped member, and thus define the inside and outside diameters of the pipe-shaped member. In embodiments of the pipe-shaped member, the cylinder-like shape has an outside perimeter that is circular, elliptical, rectangular or somewhat irregularly shaped, depending on the manufacturing technique applied to form the pipe-shaped member. The "ring-shaped" top surface described herein, is therefore not necessarily circular, but rather takes the shape of a cross-section of the pipe-shaped member.

Figure 15:
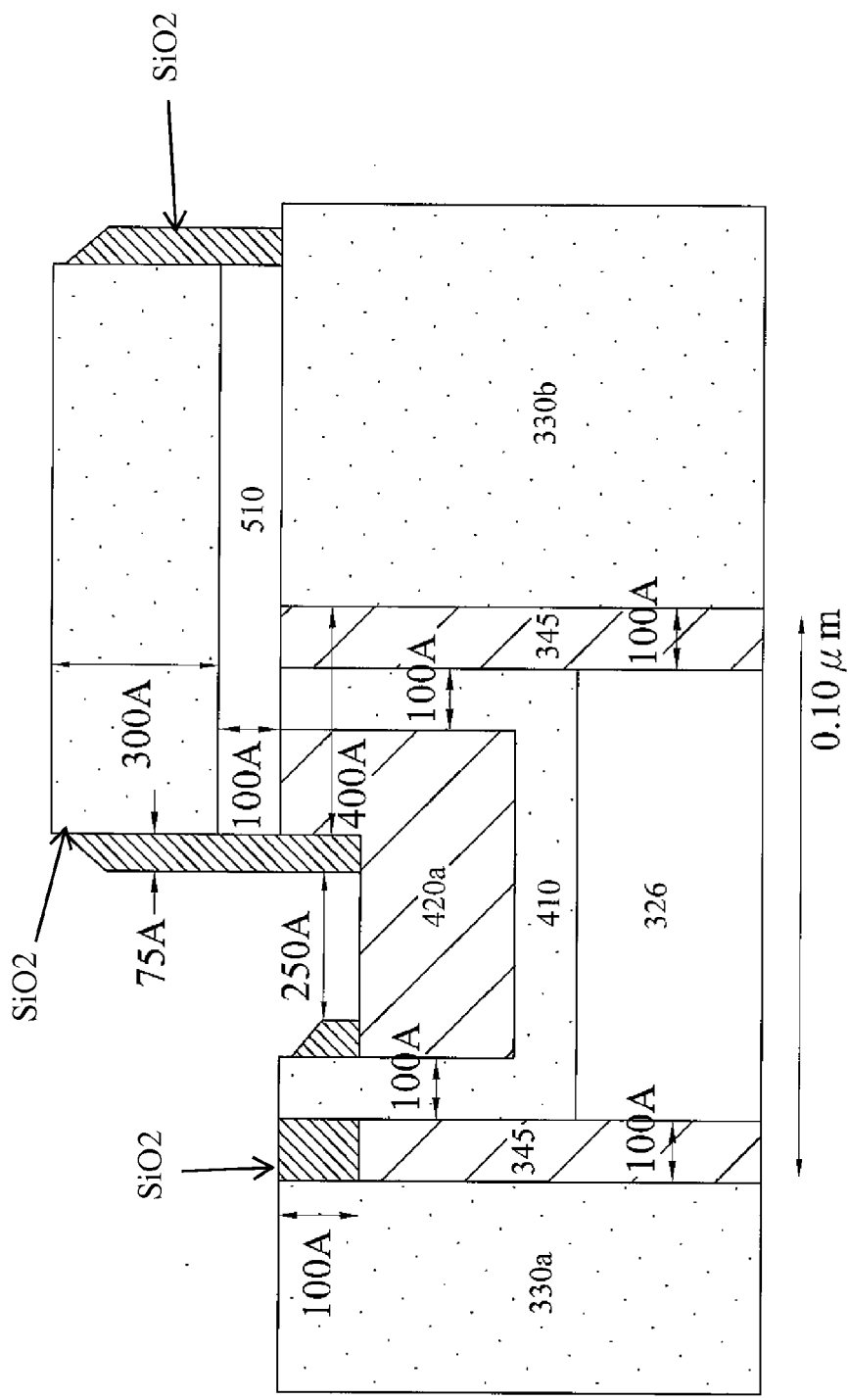
FIG. 15 illustrates a layout diagram of sample parameters for manufacturing a bridge resistance random access memory in accordance with the present invention.

FIG. 15 is a layout diagram 1400 illustrating sample parameters for manufacturing a bridge resistance random access memory. The thickness of the first electrode 345 with a circumferentially extending shape around the contact structure is about 100 Å. The liner dielectric 410 separating the first electrode 345 and the second electrode 420a has a thickness of about 100 Å. The resistance memory material bridge 510 has a width of about 400 Å that makes contact between the first electrode 345 and the second electrode 420a, and a thickness of about 100 Å.

The term "annular" includes not just a circular shape, but also includes other circumferentially extending shapes, regardless of whether it is a regular or irregular circumferentially extending shape, as dependent on a manufacturing process.

For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A memory device, comprising:
   a first electrode, electrically connected to an access device, including an annular portion with an interior area, the first electrode having an edge surface on the annular portion;
   a second electrode, electrically connected to a bit line, spaced apart from the first electrode and situated within the interior area, the second electrode having an edge surface;
   an insulating material separating the first and second electrodes; and
   a memory material in contact with the edge surface of the first electrode and the edge surface of the second electrode.

2. The device of claim 1, wherein the memory material comprises a bridge of programmable resistance memory material that extends horizontally across and in contact with the first electrode, the insulating material and the second electrode.

3. The device of claim 2, further comprising a spacer disposed over the programmable resistance memory material that protects the programmable resistance memory material from a dielectric breakthrough.

4. The device of claim 3, wherein the bit line comprises a conductive material that is deposited over the spacer, the bit line in contact with the second electrode.

5. The device of claim 1, further comprising a via formed on a top surface of the second electrode; the bit line including a conductive material deposited into the via.

6. The device of claim 2, further comprising a hard mask formed over the programmable resistance memory material.

7. The device of claim 1, wherein the first electrode extends through a contact via to a contact surface, and includes an annular structure lining the contact via and a conductive material inside the annular structure and in contact with the contact surface and filling up a portion of the contact via, said annular portion of the first electrode extending above the conductive material.

8. The device of claim 1, wherein the second electrode comprises W, TiN or TaN.

9. The device of claim 1, wherein the access device comprises a transistor.

10. The device of claim 1, wherein the first and second electrodes are disposed within a contact structure.

11. The device of claim 2, wherein the bridge of programmable resistance memory material comprises a structure having a rectangular top surface and a rectangular bottom surface, the bottom surface contacting the edges surfaces of the first and second electrodes.

12. The device of claim 2, wherein the programmable resistance memory material comprises a chalcogenide.

13. The device of claim 2, wherein the programmable resistance memory material bridge has at least two solid phases which are reversibly inducible by a current.

14. The device of claim 2, wherein the programmable resistance material has at least two solid phases which include a generally amorphous phase and a generally crystalline phase.

15. The device of claim 2, wherein the programmable resistance memory material bridge comprises GeSbTe.

16. The device of claim 2, wherein the programmable resistance memory material comprises a combination of two or more materials from the group of Ge, Sb, Te, Se, In, Ti, Ga, Bi, Sn, Cu, Pd, Pb, Ag, S, or Au.

17. The device of claim 2, wherein the programmable resistance memory material comprises a colossal magnetoresistance material.

18. The device of claim 2, wherein the programmable resistance memory material comprises a two-element compound.

* * * * *

UNITED STATES PATENT AND TRADEMARK OFFICE
CERTIFICATE OF CORRECTION

PATENT NO. : 7,608,848 B2
APPLICATION NO. : 11/382422
DATED : October 27, 2009
INVENTOR(S) : ChiaHua Ho et al.

It is certified that error appears in the above-identified patent and that said Letters Patent is hereby corrected as shown below:

In claim 13, column 12, line 37, after the word "material" delete the word "bridge".

In claim 15, column 12, line 44, after the word "material" delete the word "bridge".

Signed and Sealed this

Twelfth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,608,848 B2 Page 1 of 1
APPLICATION NO. : 11/382422
DATED : October 27, 2009
INVENTOR(S) : Ho et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 536 days.

Signed and Sealed this

Twelfth Day of October, 2010

David J. Kappos
*Director of the United States Patent and Trademark Office*